(12) United States Patent
Seo et al.

(10) Patent No.: US 7,749,846 B2
(45) Date of Patent: Jul. 6, 2010

(54) METHOD OF FORMING CONTACT STRUCTURE AND METHOD OF FABRICATING SEMICONDUCTOR DEVICE USING THE SAME

(75) Inventors: Hyeoung-Won Seo, Gyeonggi-do (KR); Sun-Hoo Park, Gyeonggi-do (KR); Soo-Ho Shin, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 285 days.

(21) Appl. No.: 12/048,145

(22) Filed: Mar. 13, 2008

(65) Prior Publication Data

US 2008/0254608 A1 Oct. 16, 2008

(30) Foreign Application Priority Data

Apr. 12, 2007 (KR) ...................... 10-2007-0036153

(51) Int. Cl.
*H01L 21/00* (2006.01)

(52) U.S. Cl. ........................ 438/270; 438/239; 438/241; 438/253; 438/272; 438/296; 257/E21.206; 257/E21.218; 257/E21.419; 257/E21.507; 257/E21.652; 257/E27.088; 257/E27.096; 257/E27.112

(58) Field of Classification Search ......... 438/239–272, 438/296, 393–396, 622–637; 257/E21.206, 257/218, 419, 429, 507, 585, 652–682, E27.088, 257/96, 112

See application file for complete search history.

(56) References Cited

U.S. PATENT DOCUMENTS

| | | | | |
|---|---|---|---|---|
| 4,894,697 A | * | 1/1990 | Chin et al. .................. 257/302 |
| 5,830,797 A | * | 11/1998 | Cleeves ...................... 438/296 |
| 6,181,014 B1 | * | 1/2001 | Park et al. ................... 257/776 |
| 6,246,607 B1 | * | 6/2001 | Mang et al. ............. 365/185.17 |
| 6,268,243 B1 | * | 7/2001 | Park ............................ 438/239 |
| 6,403,431 B1 | * | 6/2002 | Chung et al. ................ 438/296 |
| 6,432,795 B1 | * | 8/2002 | Lee ............................. 438/398 |

(Continued)

FOREIGN PATENT DOCUMENTS

JP 10-214971 8/1998

(Continued)

OTHER PUBLICATIONS

English language abstract of Japanese Publication No. 10-256509.

(Continued)

*Primary Examiner*—Michael S Lebentritt
(74) *Attorney, Agent, or Firm*—Volentine & Whitt, PLLC

(57) ABSTRACT

A method of forming a contact structure includes forming an isolation region defining active regions in a semiconductor substrate. Gate patterns extending to the isolation region while crossing the active regions are formed. A sacrificial layer is formed on the semiconductor substrate having the gate patterns. Sacrificial patterns remaining on the active regions are formed by patterning the sacrificial layer. Molding patterns are formed on the isolation region. Contact holes exposing the active regions at both sides of the gate patterns are formed by etching the sacrificial patterns using the molding patterns and the gate patterns as an etching mask. Contact patterns respectively filling the contact holes are formed. The disclosed method of forming a contact structure may be used in fabricating a semiconductor device.

25 Claims, 14 Drawing Sheets

U.S. PATENT DOCUMENTS

| | | | |
|---|---|---|---|
| 6,475,857 B1 * | 11/2002 | Kim et al. | 438/240 |
| 6,528,368 B1 * | 3/2003 | Park | 438/253 |
| 6,709,972 B2 * | 3/2004 | Park | 438/622 |
| 6,878,612 B2 | 4/2005 | Nagao et al. | |
| 6,969,653 B2 * | 11/2005 | Jwa | 438/260 |
| 7,153,745 B2 * | 12/2006 | Cho et al. | 438/270 |
| 2003/0143790 A1 * | 7/2003 | Wu | 438/197 |
| 2004/0207005 A1 * | 10/2004 | Kim et al. | 257/315 |
| 2006/0138513 A1 * | 6/2006 | Hong et al. | 257/300 |
| 2007/0020799 A1 * | 1/2007 | Choi et al. | 438/103 |

FOREIGN PATENT DOCUMENTS

| | | |
|---|---|---|
| JP | 10-256509 | 9/1998 |
| KR | 2001-0004237 | 1/2001 |
| KR | 2003-0001969 | 1/2003 |
| KR | 2003-0014857 | 2/2003 |
| KR | 10-2004-0101658 | 12/2004 |
| KR | 10-2004-0102636 | 12/2004 |

OTHER PUBLICATIONS

English language abstract of Korean Publication No. 2001-0004237.
English language abstract of Korean Publication No. 2003-0001969.
English language abstract of Korean Publication No. 10-2004-0101658.

* cited by examiner

US 7,749,846 B2

METHOD OF FORMING CONTACT STRUCTURE AND METHOD OF FABRICATING SEMICONDUCTOR DEVICE USING THE SAME

CROSS-REFERENCE TO RELATED APPLICATION

This application claims the benefit of foreign priority to Korean Patent Application No. 10-2007-0036153, filed on Apr. 12, 2007, the disclosure of which is hereby incorporated herein by reference in its entirety as if set forth fully herein.

BACKGROUND

1. Technical Field

Embodiments of the present invention relate to methods of forming a contact structure and methods of fabricating a semiconductor device using the same. More particularly, embodiments of the present invention relate to a method of forming a contact structure capable of being used in fabricating a highly integrated semiconductor device and a method of fabricating a semiconductor device using a method of forming the contact structure.

2. Discussion of the Related Art

As the integration density of semiconductor devices is increased with high capacity, it has been recently required to ensure a process for minimizing the size of semiconductor chips. As the design rule and chip size of memory cells in a semiconductor device such as DRAM are reduced, it is difficult to overcome the limitation of a photolithography process and secure a sufficient process margin. Particularly, since the size of contact holes and the interval therebetween are more reduced as the integration density of semiconductor devices is increased, it is difficult to perform a photolithography process for forming the contact holes.

A method of forming contact holes has been disclosed in U.S. Pat. No. 6,878,612 issued to by Nagao et al. (hereinafter "Nagao"), entitled "Self-Aligned Contact Process for Semiconductor Device."

As can be understood from Nagao, first and second gate electrodes are formed on a semiconductor substrate, and a silicon nitride layer having a uniform thickness is formed on the semiconductor substrate having the first and second gate electrodes. A silicon oxide layer having a planarized top surface and filling between the first and second gate electrodes is formed on the semiconductor substrate having the silicon nitride layer. Subsequently, a mask pattern having an opening is formed on the silicon oxide layer. The mask pattern is formed as a photoresist pattern. Thereafter, a contact hole is formed between the first and second gate electrodes by dry etching the silicon oxide layer using the mask pattern as an etching mask.

According to Nagao, a contact hole is formed by dry etching a silicon nitride layer using photolithography and dry etching processes. A method of forming a contact hole using a photoresist pattern as an etching mask is difficult to be applied to the fabrication of highly integrated semiconductor devices. This is because an interval between contact holes formed in different device formation regions becomes smaller as semiconductor devices are highly integrated. Therefore, since a process margin for forming contact holes formed in different device formation regions is reduced, there may be a limit in improving the yield rate of semiconductor devices.

SUMMARY

One embodiment of the present invention can be characterized as a method for forming a contact structure.

Another embodiment of the present invention can be characterized as a method of fabricating a semiconductor device using the method of forming a contact structure.

One embodiment described herein can be characterized as a method of forming a contact structure. The method may include forming line patterns on a substrate, wherein the line patterns are substantially parallel with one another; forming molding patterns between the line patterns, wherein the molding patterns are spaced apart from one another; and forming a contact pattern between the molding patterns and between the line patterns.

Another embodiment described herein can be characterized as a method of forming a contact structure. The method may include forming an isolation region defining active regions in a semiconductor substrate; forming gate patterns extending to the isolation region while crossing the active regions; forming a sacrificial layer on the semiconductor substrate having the gate patterns; patterning the sacrificial layer thereby forming sacrificial patterns remaining on the active regions; forming molding patterns on the isolation region; etching the sacrificial patterns using the molding pattern and the gate pattern as an etching mask thereby forming contact holes exposing the active regions at both sides of the gate patterns; and forming contact patterns respectively filling the contact holes.

Yet another embodiment described herein can be characterized as a method of fabricating a semiconductor device. The method may include preparing a semiconductor substrate; forming an isolation region defining active regions in the semiconductor substrate; forming gate patterns on the active regions and the isolation region, each of the gate patterns having a line shape crossing the active regions, wherein the gate patterns are spaced apart from one another; forming first molding patterns between the gate patterns, wherein the first molding patterns are spaced apart from one another; and forming contact patterns between the first molding patterns and between the gate patterns.

BRIEF DESCRIPTION OF THE DRAWINGS

The above and other embodiments of the present invention will become more apparent to those of ordinary skill in the art by describing in detail the attached drawings in which.

DETAILED DESCRIPTION

Figure 1:
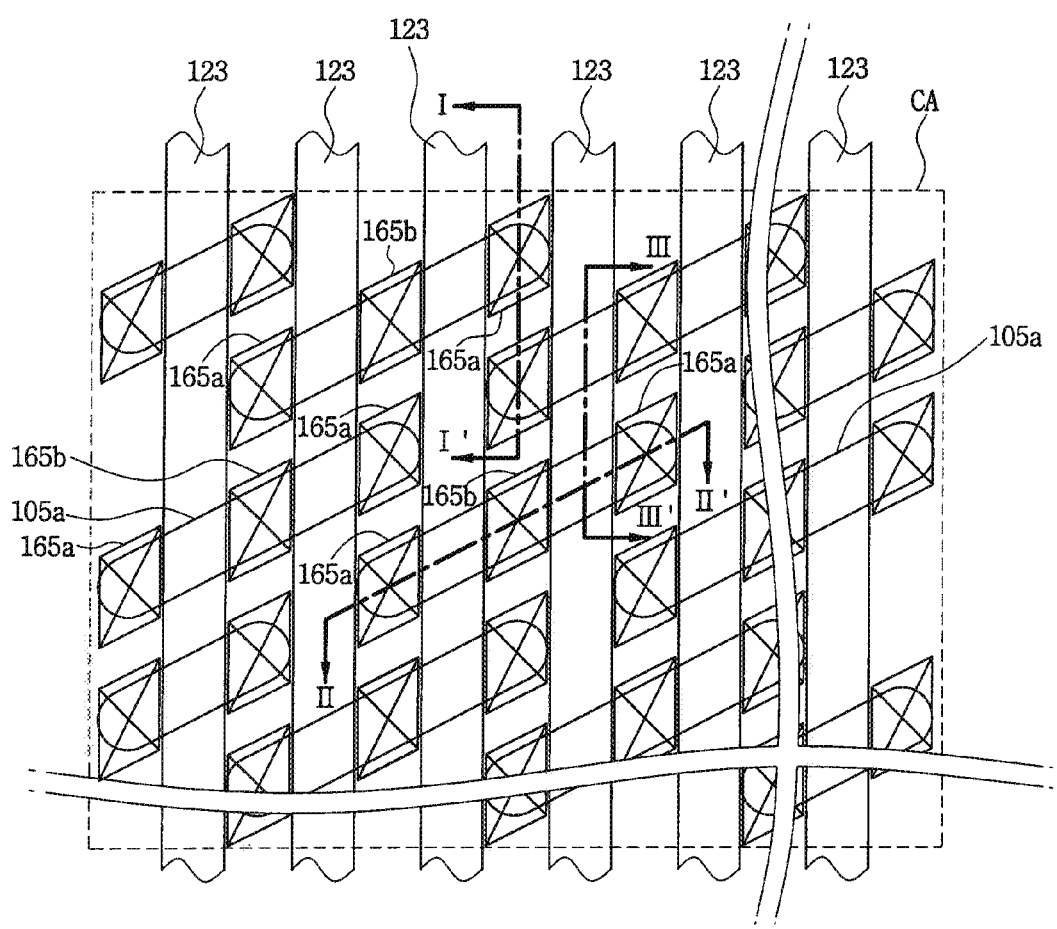
FIG. 1 is a plan view of a semiconductor device according to some embodiments of the present invention.
Figure 2A:
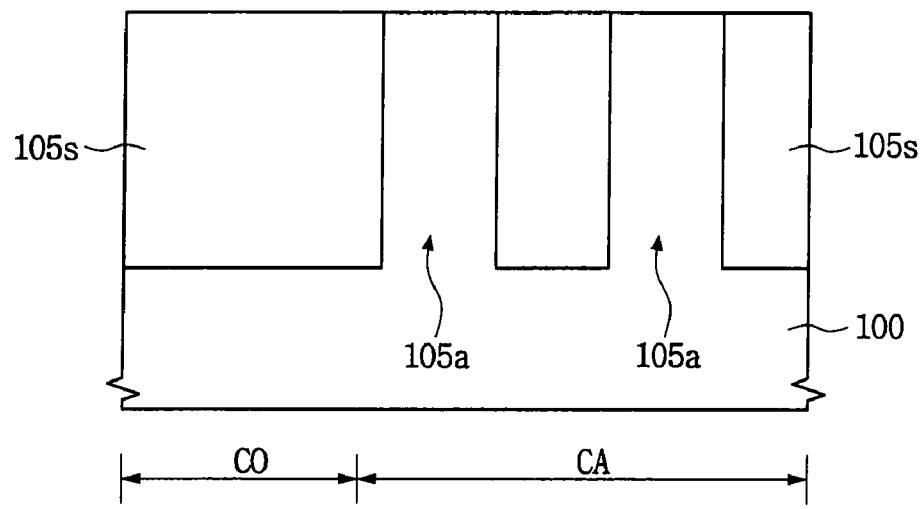
FIGS. 2A through 9C are cross-sectional views of the semiconductor device according to some embodiments of the present invention.
Figure 2B:
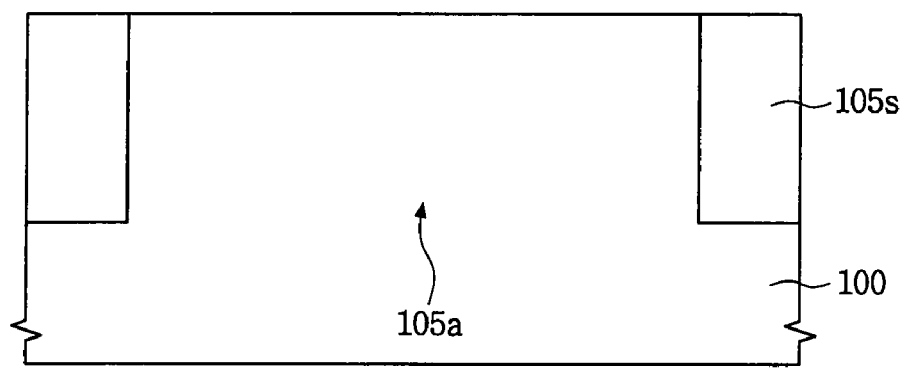
Figure 2C:
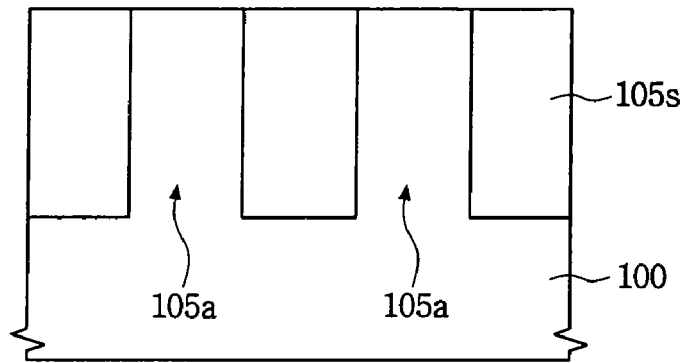
Figure 3A:
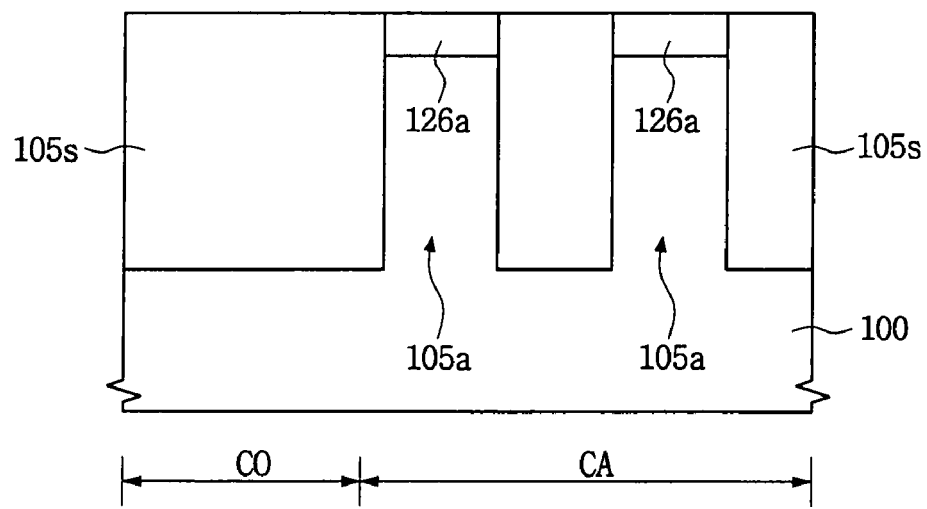
Figure 3B:
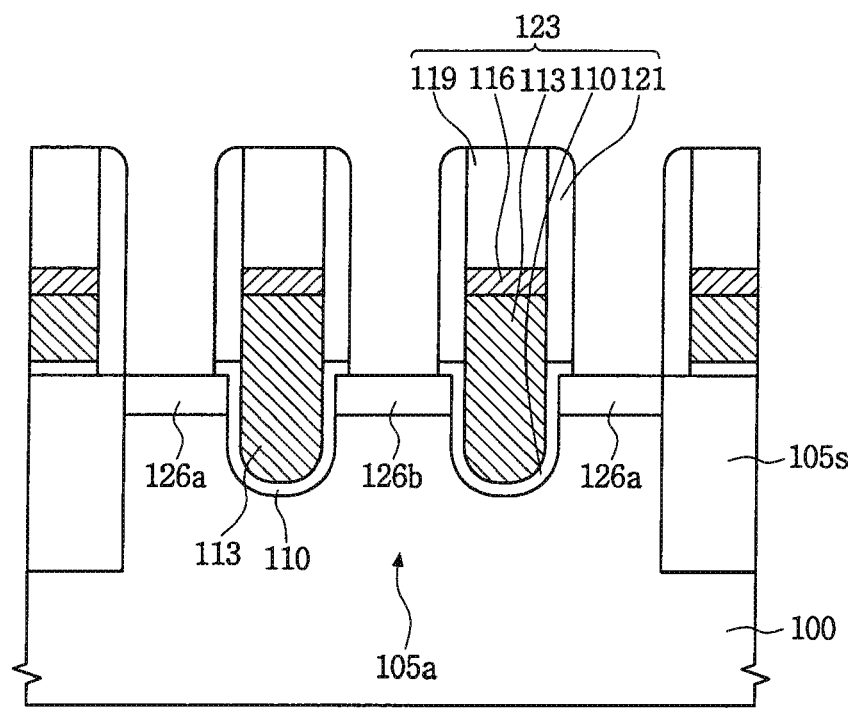
Figure 3C:
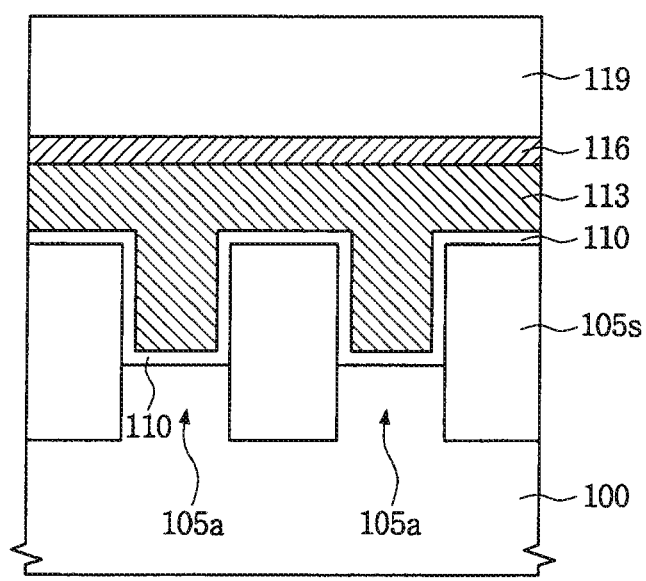
Figure 4A:
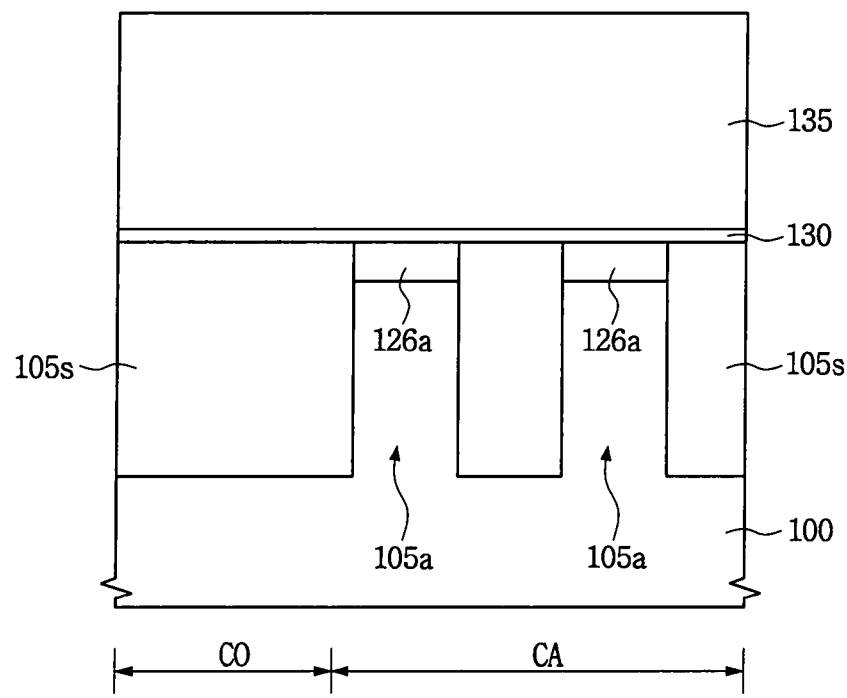
Figure 4B:
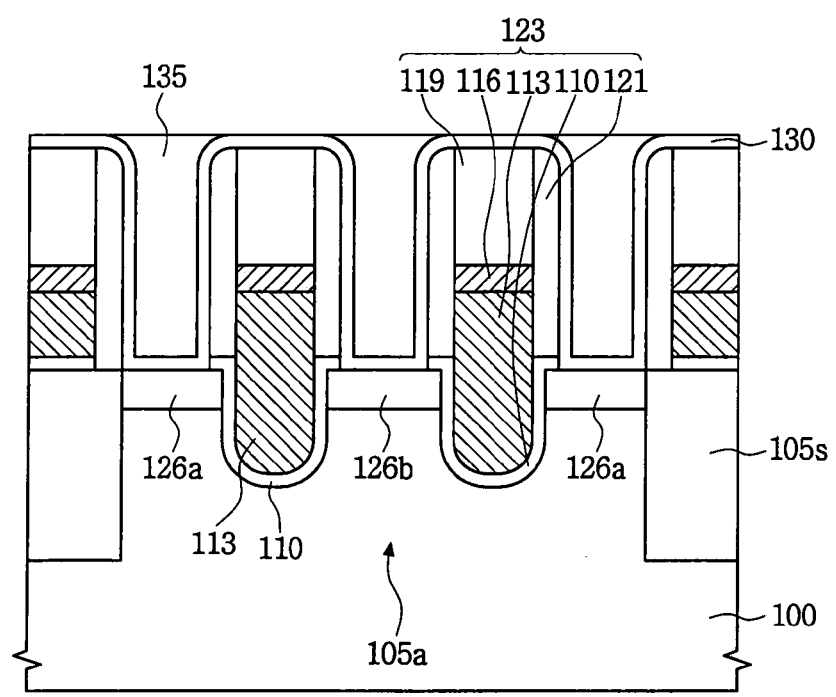
Figure 4C:
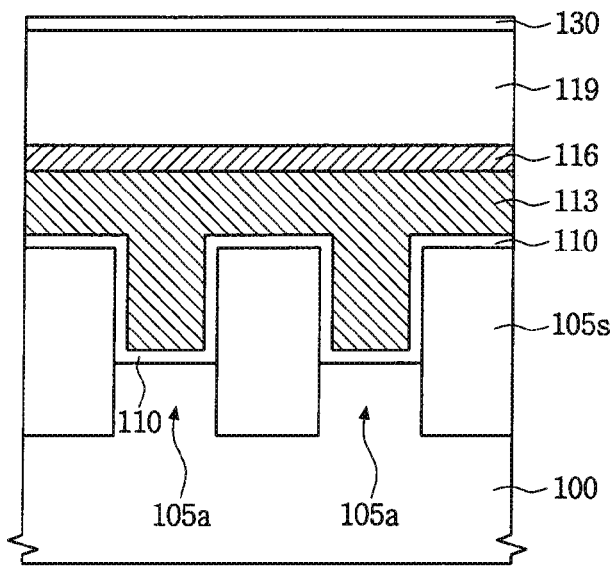
Figure 5A:
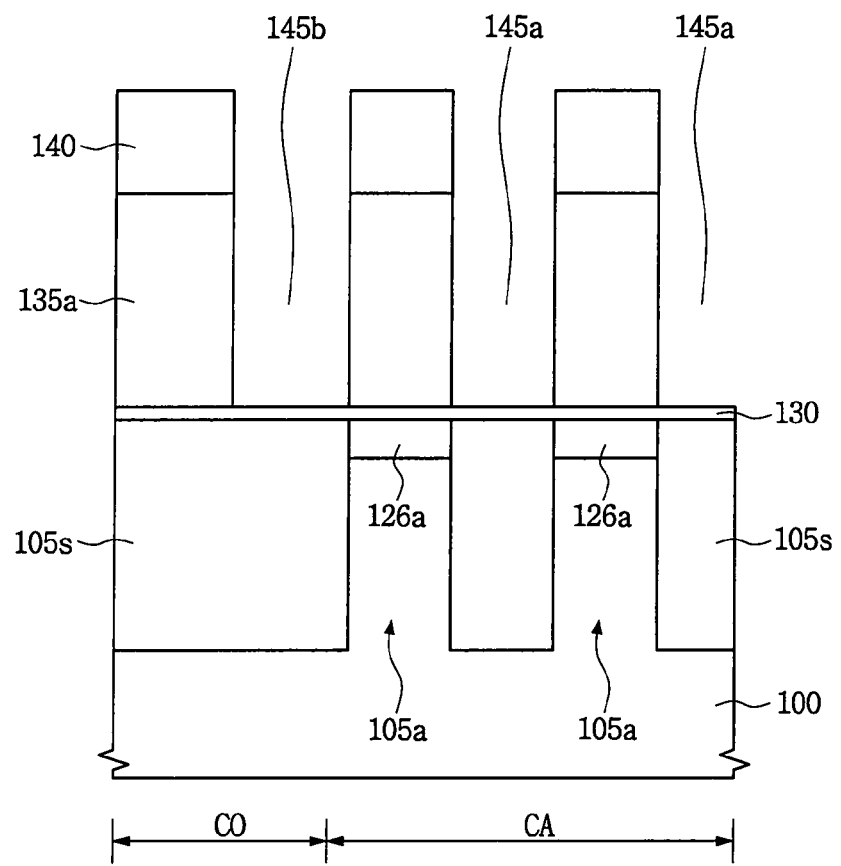
Figure 5B:
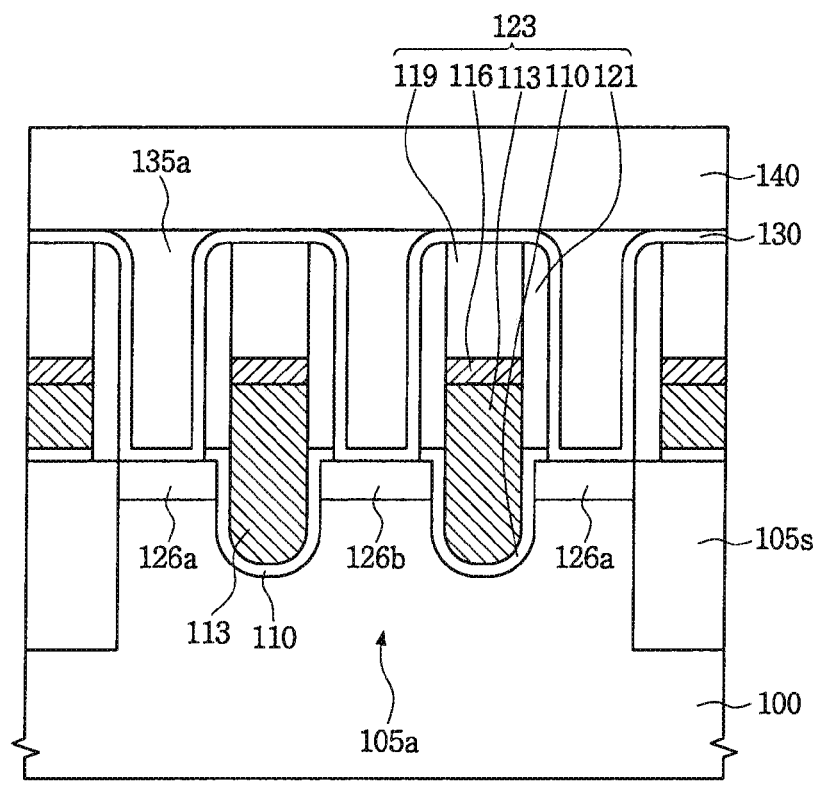
Figure 5C:
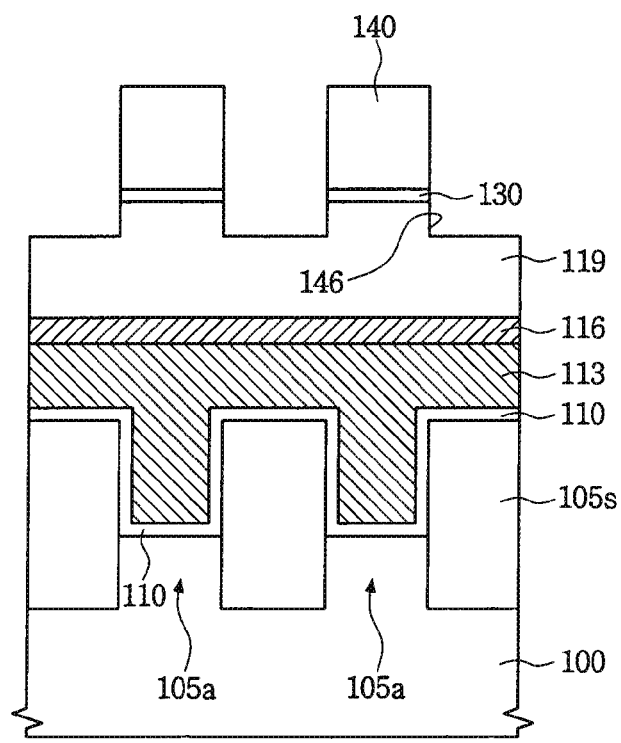
Figure 6A:
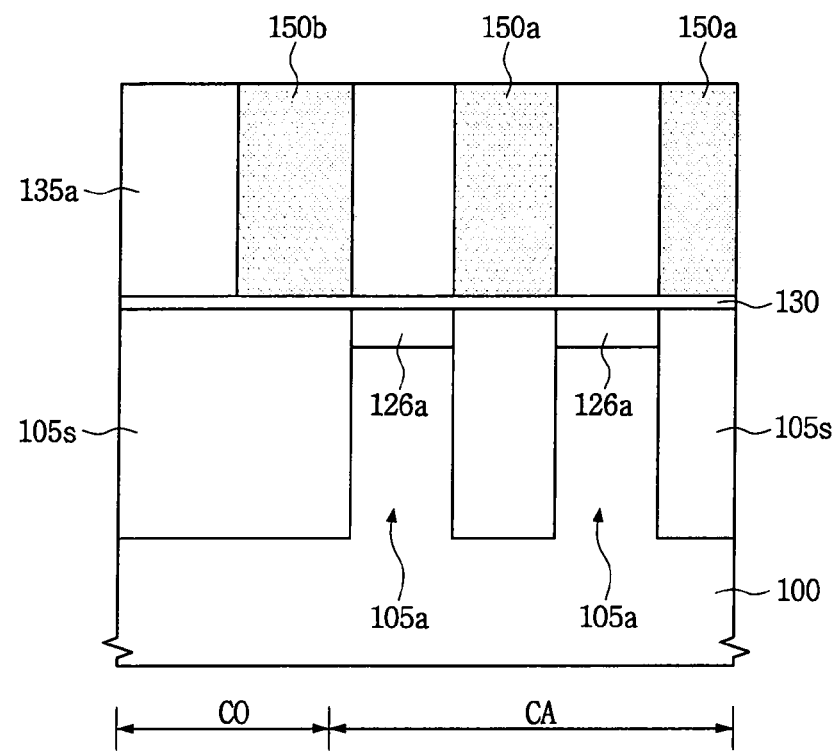
Figure 6B:
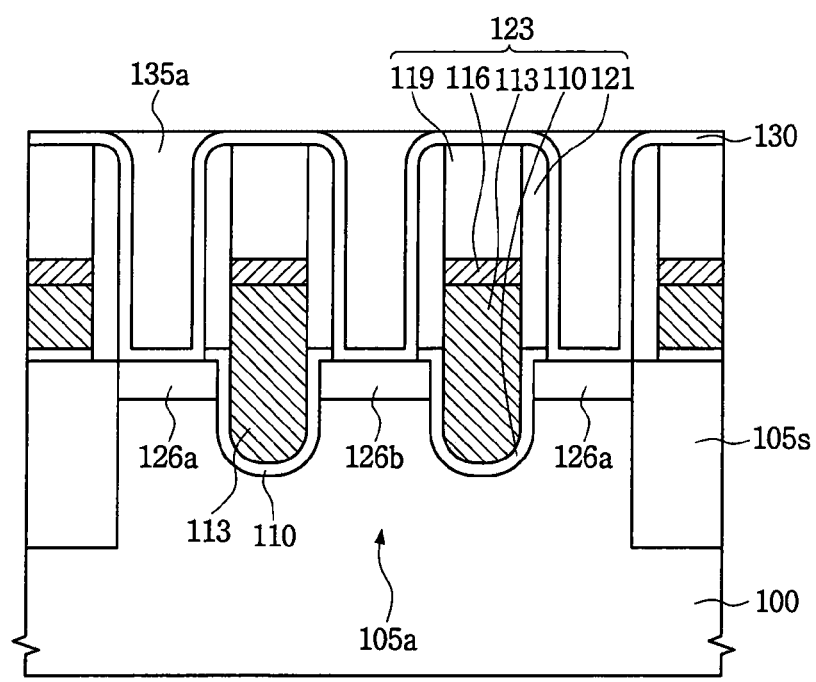
Figure 6C:
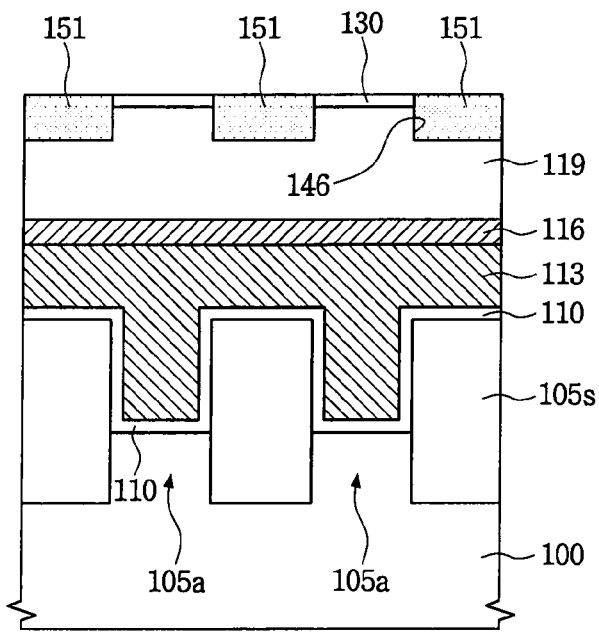

Embodiments of the present invention will now be described more fully hereinafter with reference to the accompanying drawings, in which preferred embodiments of the invention are shown. These embodiments may, however, be realized in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Hereinafter, a method of fabricating a semiconductor device according to some embodiments of the present invention will be described with reference to FIGS. 1 and 2A through 9C. FIG. 1 is a plan view of a semiconductor device according to some embodiments of the present invention. FIGS. 2A, 3A, 4A, 5A, 6A, 7A, 8A and 9A are cross-sectional views taken along line I-I' in FIG. 1. FIGS. 2B, 3B, 4B, 5B, 6B, 7B, 8B and 9B are cross-sectional views taken along line II-II' in FIG. 1. FIGS. 2C, 3C, 4C, 5C, 6C, 7C, 8C and 9C are cross-sectional views taken along line III-III' in FIG. 1. In FIGS. 2A, 3A, 4A, 5A, 6A, 7A, 8A and 9A, reference numeral "CA" denotes a cell array region, and reference numeral "CO" denotes a core region.

Referring to FIGS. 1, 2A, 2B and 2C, a semiconductor substrate 100 having a cell array region CA and a core region CO is prepared. An isolation region 105s defining active regions 105a may be formed in the semiconductor substrate 100. When viewing the cell array region CA as a plan view, each of the active regions 105a has major and minor axes. The active regions 105a may be two-dimensionally arrayed along directions of the major and minor axes. The isolation region 105s may be formed using a shallow trench isolation technology. For example, the forming of the isolation region 105s may include forming a trench in the semiconductor substrate 100 and forming an insulating layer filling the trench. After forming a trench in the semiconductor substrate 100, a buffer oxide layer and an insulative liner may be sequentially formed on an inner wall of the trench.

Referring to FIGS. 1, 3A, 3B and 3C, line patterns spaced apart from one another may be formed on the active regions 105a and the isolation region 105s. Each of the line patterns may include a conductive pattern and a capping mask, which are sequentially stacked, and a spacer formed on sidewalls of the conductive pattern and the capping mask.

In one embodiment, the line patterns may be gate patterns 123 of the semiconductor device. For example, the gate patterns 123 may be formed to extend to the isolation region 105s while crossing over the active regions 105a. Each of the gate patterns 123 may have a line shape and extend along a direction crossing the active regions 105a. The gate patterns 123 may be formed to cross the cell array region CA.

Each of the gate patterns 123 may be formed to pass between active regions electrically irrelative to each other for the purpose of easiness of design and high integration. To constitute a circuit, each of the gate patterns 123 may be formed to pass above the plurality of active regions 105a. One or two or more of the gate patterns 123 may be positioned on each of the active regions 105a. The gate patterns 123 may be arranged to be positioned between the active regions 105a arranged along the direction of the major axis.

In the active regions 105a, each of the gate patterns 123 may include a gate dielectric layer 110, a gate electrode 113 and a capping mask 119, which are sequentially stacked. The forming of the gate patterns 123 may include sequentially forming a gate dielectric layer 110 and a gate conductive layer on the semiconductor substrate 100 having the active regions 105a, forming a capping mask 119 on the gate conductive layer, and etching the gate conductive layer using the capping mask 119 as an etching mask. A metal silicide 116 may be interposed between the gate electrode 113 and the capping mask 119. The gate dielectric layer 110 may include a material such as silicon oxide, a high-k dielectric, or the like or a combination thereof. The gate electrode 113 may include a metal, a metal nitride, doped poly-silicon, or the like or a combination thereof. The capping mask 119 may include silicon oxide, silicon nitride, or the like or a combination thereof.

The forming of the gate patterns 123 may further include forming gate trenches crossing the active regions 105a before forming the gate dielectric layer 110. Thus, the gate patterns 123 may be formed to fill the gate trenches. Accordingly, transistors having recessed channel regions can be provided.

Each of the gate patterns 123 may further include a gate spacer 121 formed on sidewalls of the gate electrode 113 and the capping mask 119. The gate spacer 121 may include silicon oxide, silicon nitride, or the like or a combination thereof.

Impurity regions 126a and 126b may be formed in the active regions 105a at both sides of each of the gate patterns 123. Thus, transistors may be provided in the active regions 105a. The transistors may have recessed channel regions.

In the illustrated embodiment, a pair of gate patterns may be formed on one active region in the active regions 105a having the major and minor axes. In this case, each of the active regions 105a may be divided into three regions by the pair of gate patterns. The gate patterns may be positioned between the active regions 105a arranged along the direction of the major axis. First impurity regions 126a may be formed in active regions positioned at both sides of the pair of gate patterns, and a second impurity region 126b may be formed in an active region positioned between the pair of gate patterns. The first and second impurity regions 126a and 126b may have the same conductive type.

Referring to FIGS. 1, 4A, 4B and 4C, an etch stop layer 130 may be formed on the semiconductor substrate 100 having the transistors. The etch stop layer 130 may be conformally formed. The etch stop layer 130 may be formed of a material having an etching selection ratio with respect to the isolation region 105s. For example, when the isolation region 105s is formed as a silicon oxide layer, the etch stop layer 130 may include silicon nitride.

A sacrificial layer 135 may be formed on the semiconductor substrate 100 having the etch stop layer 130. The sacrificial layer 135 may be formed to have a substantially flat top surface. For example, the forming of the sacrificial layer 135 may include forming a sacrificial material layer on the semiconductor substrate 100 having the etch stop layer 130 and planarizing the sacrificial material layer using an etch-back technology or a chemical mechanical polishing (CMP) technology. Thus, the sacrificial layer 135 may fill void spaces present at both sides of the gate patterns 123. In one embodiment, the sacrificial layer 135 may be formed to cover the gate patterns 123.

The sacrificial layer 135 may include a material having an etching selection ratio with respect to the etch stop layer 130. For example, when the etch stop layer 130 is formed as a silicon nitride layer, the sacrificial layer 135 may include silicon oxide, SiGe, or the like or a combination thereof.

In one embodiment, the sacrificial layer 135 may include a material having an etching selection ratio with respect to the gate spacer 121 and the capping mask 119.

In another embodiment, the sacrificial layer 135 may include a material having an etching selection ratio with respect to the isolation region 105s. When the isolation region 105s is formed as a silicon oxide layer, the sacrificial layer 135 may include silicon nitride.

Referring to FIGS. 1, 5A, 5B and 5C, mask patterns 140 overlapping with the active regions 105a in the cell array region CA and crossing the cell array region CA may be formed on the sacrificial layer 135. In the cell array region CA, each of the mask patterns 140 may be formed in a line shape extending along a direction crossing the gate patterns 123. In one embodiment, the mask patterns 140 may be formed as photoresist patterns. In another embodiment, each of the mask patterns 140 may be formed as a hard mask pattern including a material having an etching selection ratio with respect to the sacrificial layer 135.

Sacrificial patterns 135*a* having first openings 145*a* may be formed by etching the sacrificial layer 135 using the mask patterns 140 as an etching mask. In the cell array region CA, the sacrificial patterns 135*a* may be formed beneath the mask patterns 140. That is, in the cell array region CA, the sacrificial patterns 135*a* may be formed on the active regions 105*a*. For example, the sacrificial patterns 135*a* remaining beneath the mask patterns 140 may be formed by anisotropically etching the sacrificial layer 135 through a dry etching process using the mask patterns 140 as an etching mask. Here, the first openings 145*a* may be positioned between the active regions 105*a*.

While forming the first openings 145*a*, a second opening 145*b* surrounding the cell array region CA may be formed in the core region CO. For example, the mask patterns 140 may be formed to cross the cell array region CA and to have an opening surrounding the cell array region CA in the core region CO. Thus, the first and second openings 145*a* and 145*b* may be formed by etching the sacrificial layer 135 using the mask patterns 140 as an etching mask.

While anisotropically etching the sacrificial layer 135 using the mask patterns 140 as an etching mask, a portion of the capping mask 119 of the gate patterns 123 positioned at both sides of the mask patterns 140 may be etched. Thus, a recessed region 146 may be formed in the capping mask 119.

Referring to FIGS. 1, 6A, 6B and 6C, the mask patterns 140 can be removed. Subsequently, first molding patterns 150*a* filling the first openings 145*a* may be formed, and a second molding pattern 150*b* filling the second opening 145*b* may be formed. For example, the forming of the first and second molding patterns 150*a* and 150*b* may include forming a molding material layer on the semiconductor substrate 100 having the first and second openings 145*a* and 145*b*, and planarizing the molding material layer using an etch-back technology or a CMP technology. A third molding pattern 151 may be formed by allowing the molding material layer to remain in the recessed region 146.

Each of the first and second molding patterns 150*a* and 150*b* may be formed as an insulating material layer having an etching selection ratio with respect to the sacrificial patterns 135*a*. For example, when each of the sacrificial patterns 135*a* is formed as a silicon nitride layer, each of the first and second molding patterns 150*a* and 150*b* may include silicon oxide. On the contrary, when each of the sacrificial patterns 135*a* is formed as a silicon oxide layer, each of the first and second molding patterns 150*a* and 150*b* may, for example, include silicon nitride.

Referring to FIGS. 1, 7A, 7B and 7C, a photoresist pattern 155 may be formed on the semiconductor substrate 100 having the first and second molding patterns 150*a* and 150*b*. The photoresist pattern 155 may have an opening exposing the cell array region CA. The photoresist pattern 155 may overlap with the second molding pattern 150*b*.

First and second contact holes 160*a* and 160*b*, respectively, exposing the active regions 105*a* at both sides of the gate patterns 123 may be formed by sequentially etching the sacrificial patterns 135*a* and the etch stop layer 130 beneath the sacrificial patterns 135*a* using the first and second molding patterns 150*a* and 150*b*, the gate patterns 123 and the photoresist pattern 155 as an etching mask. For example, in the cell array region CA, the first contact holes 160*a* exposing the first impurity regions 126*a* at one side of the gate patterns 123 may be formed, and the second contact holes 160*b* exposing the second impurity regions 126*b* at the other side of the gate patterns 123 may be formed. In the core region CO, the sacrificial patterns 135*a* overlapping with the photoresist pattern 155 may remain. In the illustrated embodiment, the first and second contact holes 160*a* and 160*b* may be formed without forming a photoresist pattern having hole-type openings. Thus, although a high-resolution photolithography equipment is not used, the first and second contact holes 160*a* and 160*b* may be formed.

Figure 7A:
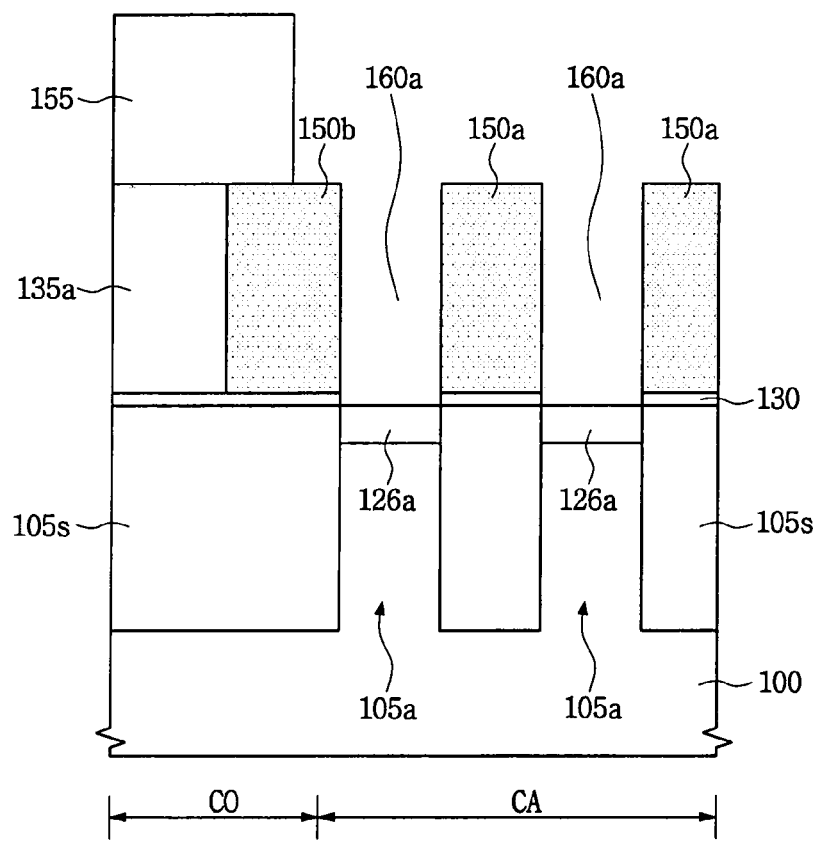
Figure 7B:
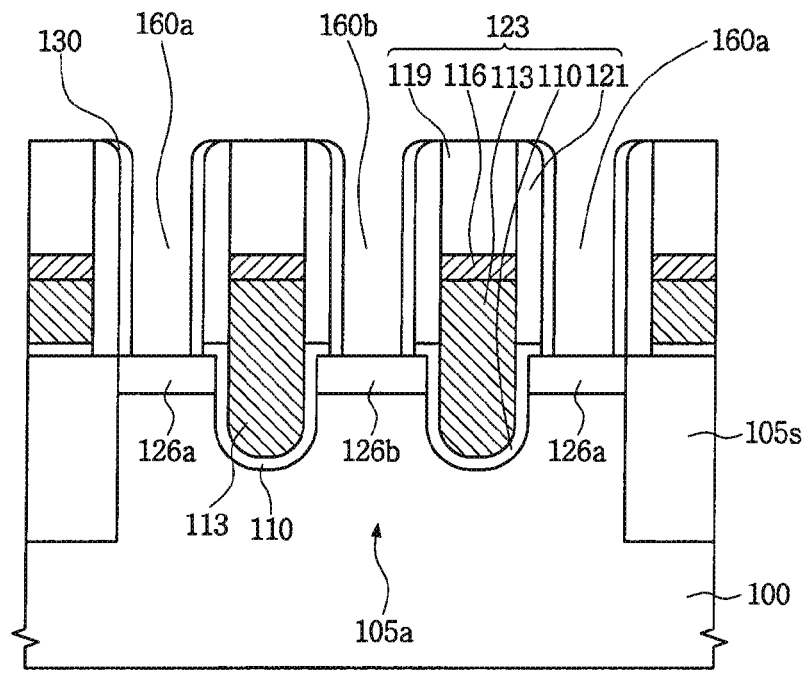
Figure 7C:
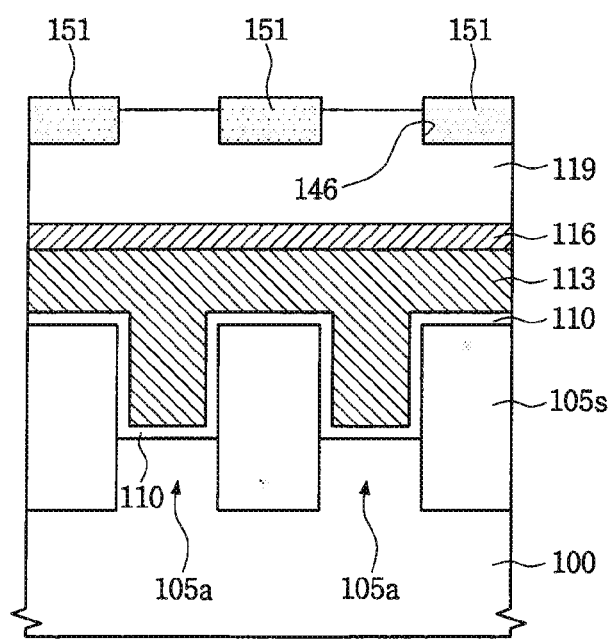
Figure 8A:
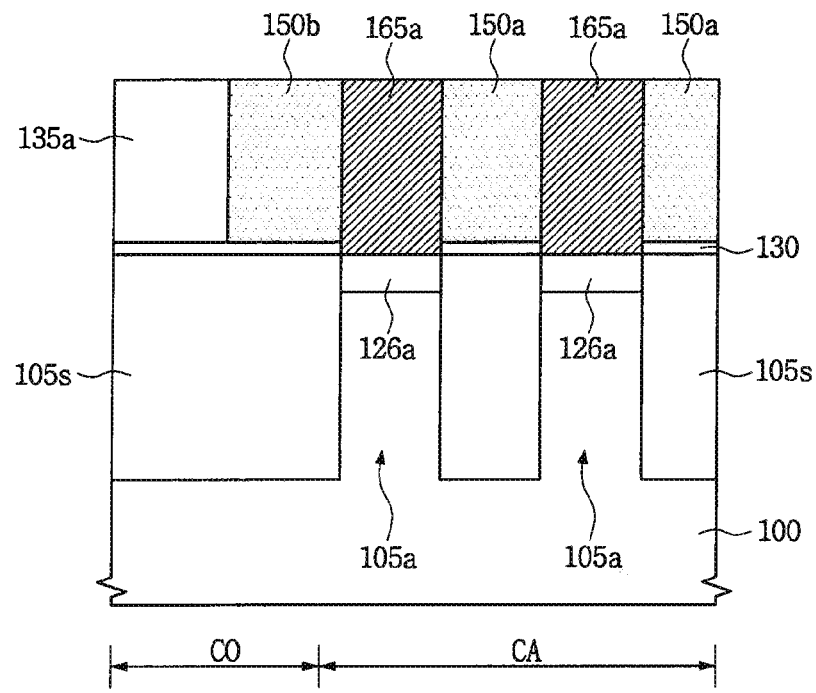
Figure 8B:
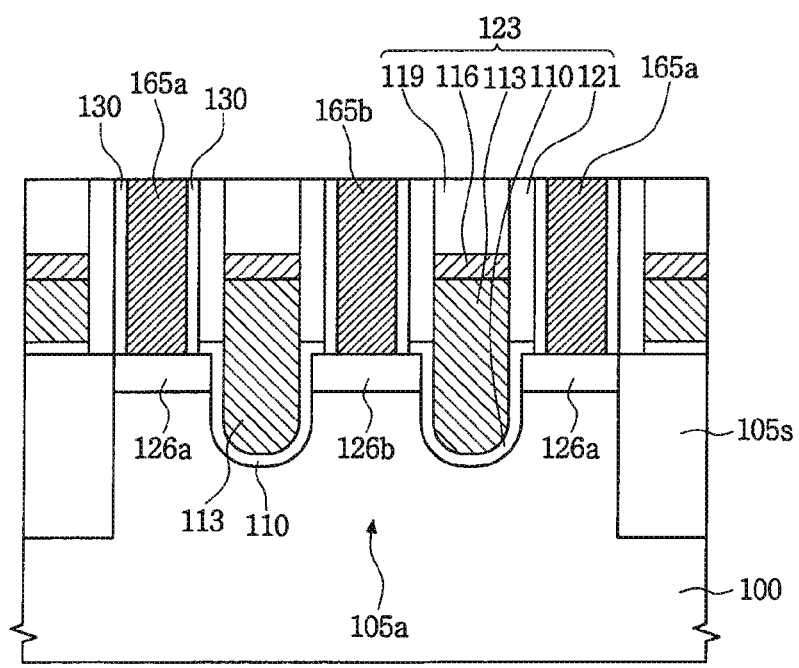
Figure 8C:
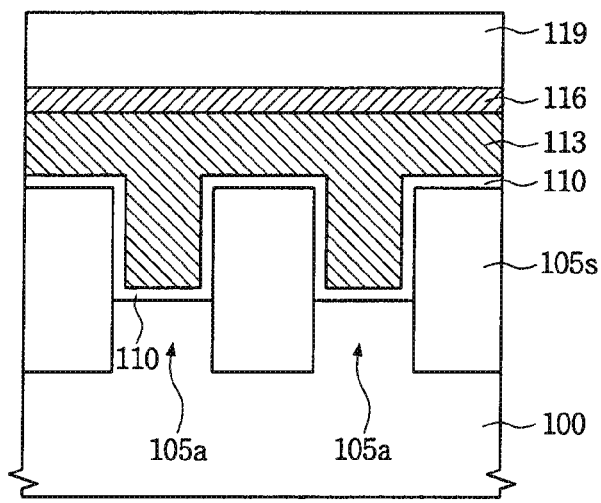
Figure 9A:
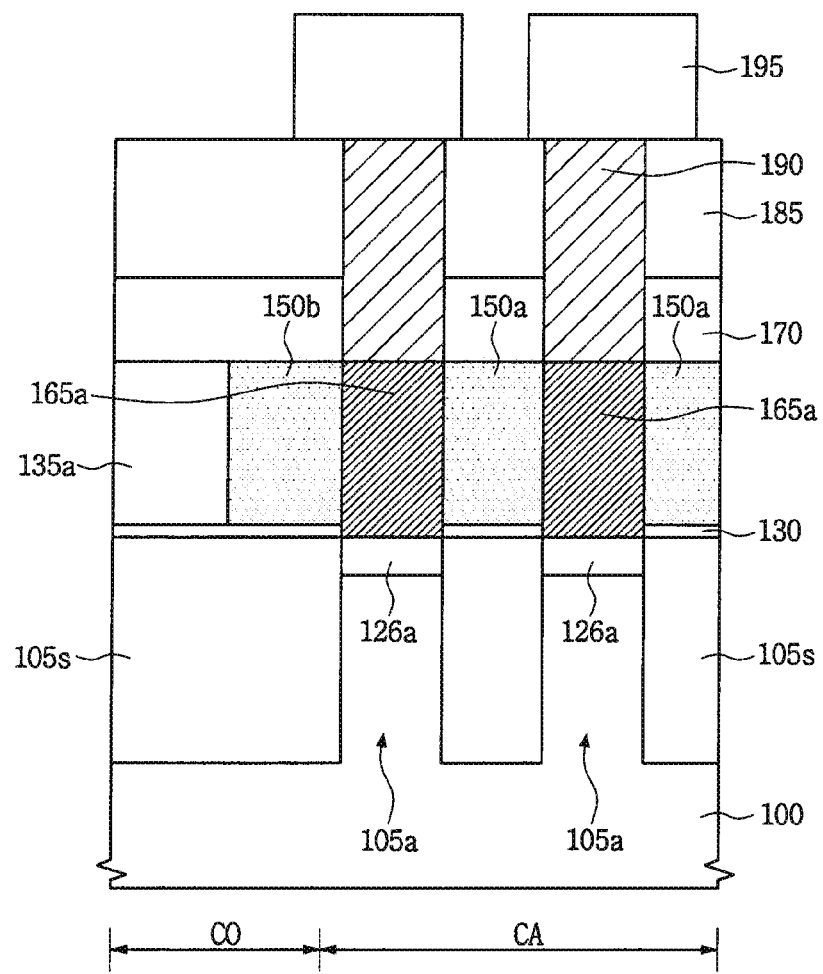
Figure 9B:
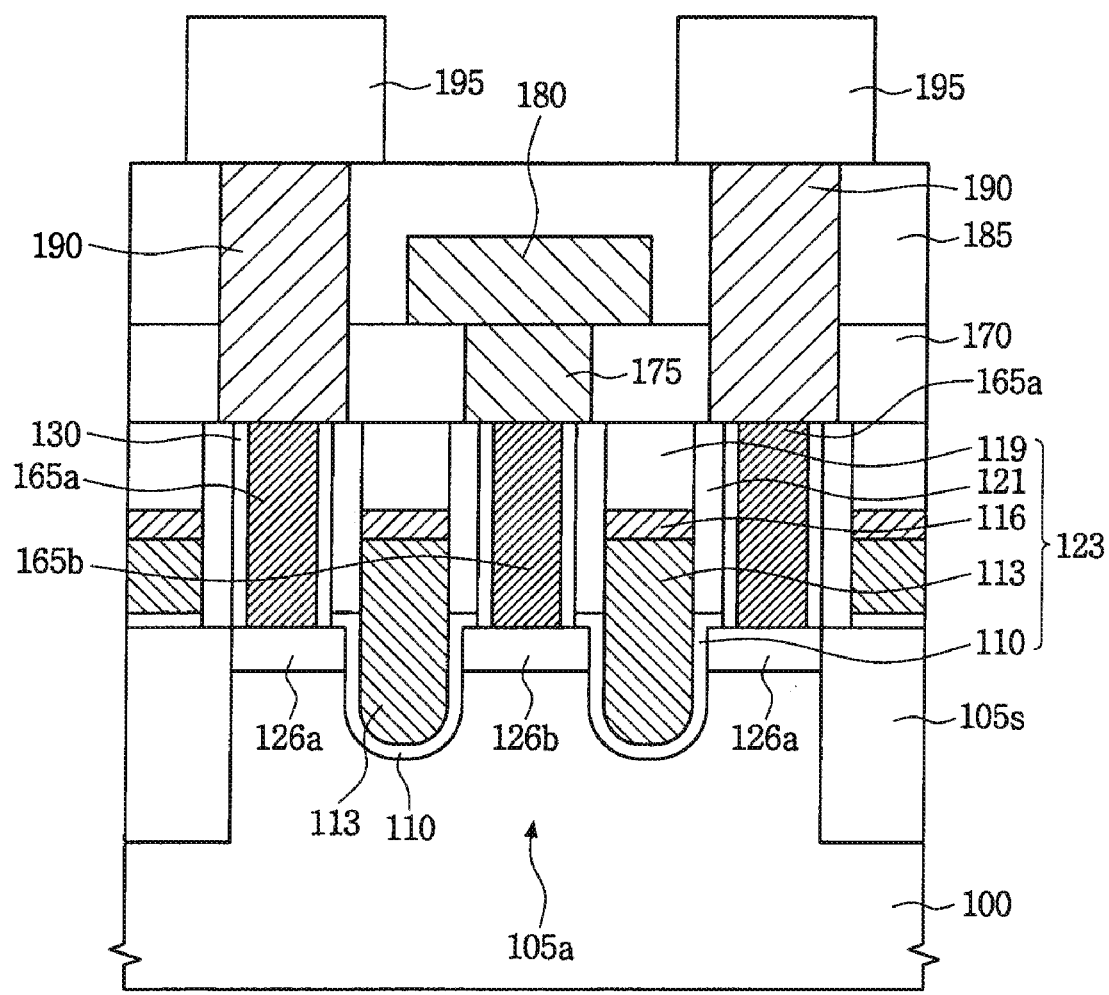
Figure 9C:
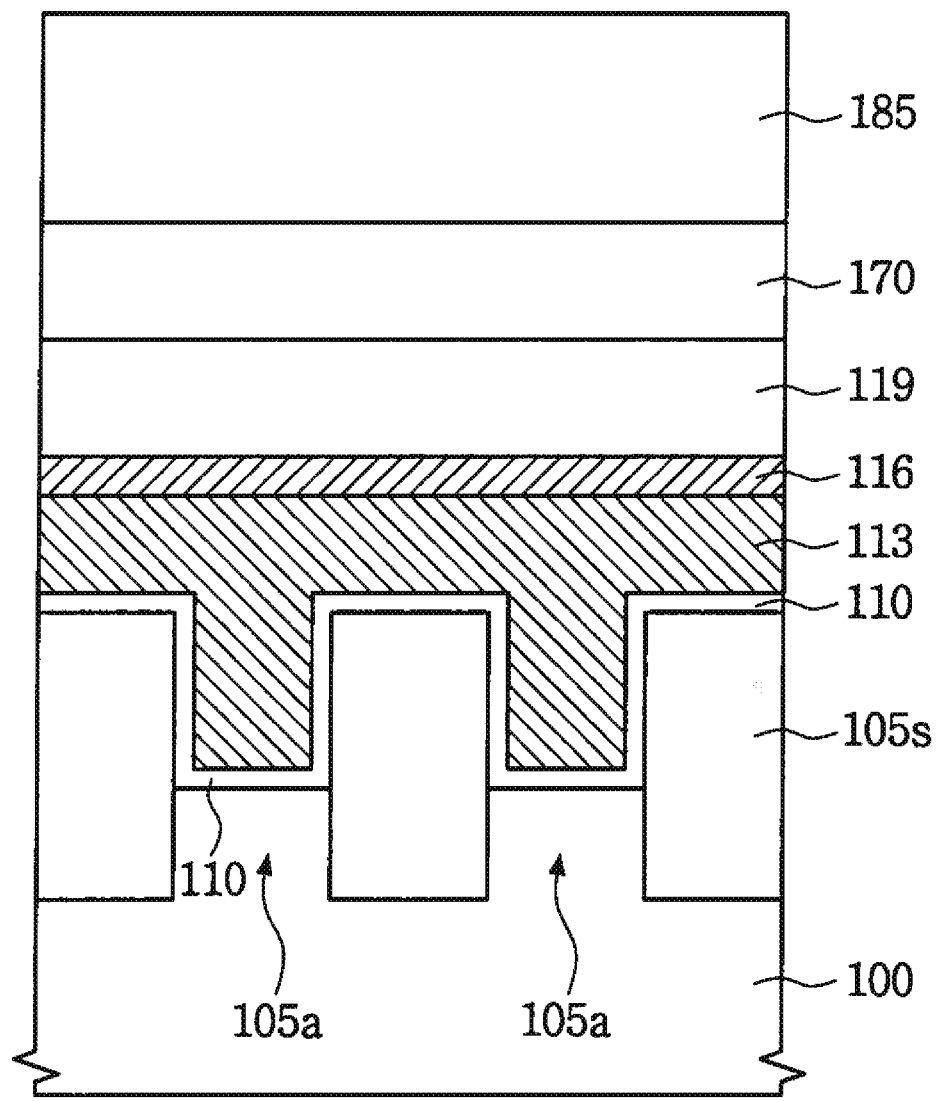

To form the contact holes 160*a* and 160*b*, the sacrificial patterns 135*a* and the etch stop layer 130 may be etched using dry and/or wet etching processes. For example, the forming of the first and second contact holes 160*a* and 160*b* may include isotropically etching the sacrificial patterns 135*a* and anisotropically etching the etch stop layer 130. As a result, the etch stop layer 130 may remain on sidewalls of the gate patterns 123 as illustrated in FIG. 7B.

In the cell array region CA, the sacrificial patterns 135*a* may be removed through a wet etching process. Because the sacrificial patterns 135*a* are wet etched, other patterns exposed through an etching process, e.g., the gate patterns, can be prevented from being etched. Because the gate patterns 123 positioned on the active regions 105*a* can be prevented from being exposed in a dry etching process, a failure in which the gate electrodes are exposed by etching the gate patterns through the dry etching process can be prevented.

In one embodiment, the first and second contact holes 160*a* and 160*b* may be formed by etching the sacrificial patterns 135*a* and the etch stop layer 130 using a wet etching process. For example, in embodiments where the sacrificial patterns 135 are formed as a silicon oxide layer, the sacrificial patterns 135*a* may be etched using an etchant containing fluorine acid. In other embodiments where the sacrificial patterns 135 are formed as a silicon nitride layer, the sacrificial patterns 135*a* may be etched using an etchant containing phosphoric acid.

In another embodiment, the forming of the photoresist pattern 155 may be omitted. When the forming of the photoresist pattern 155 is omitted, the sacrificial patterns 135*a* may be etched using the first and second molding patterns 150*a* and 150*b* and the gate patterns 123 as an etching mask until the etch stop layer 130 is exposed. While etching the sacrificial patterns 135*a*, the etch stop layer 130 can prevent the isolation region 105*s* from being etched. Subsequently, the first and second contact holes 160*a* and 160*b* may be formed by etching the etch stop layer 130 such that the first and second impurity regions 126*a* and 126*b* are exposed at both sides of the gate patterns 123.

Since the forming of the first and second contact holes 160*a* and 160*b* includes etching the sacrificial patterns 135*a* using the first and second molding patterns 150*a* and 150*b* and the gate patterns 123 as an etching mask, a sufficient process margin for forming the first and second contact holes 160*a* and 160*b* can be ensured. In addition, since the previously-formed first molding patterns 150*a* are interposed between contact holes formed on adjacent active regions, the limitation of a photolithography process for forming fine contacts hole can be overcome. That is, since an interval between contact holes can be easily controlled in a process of forming the first molding patterns 150*a*, the size of each of the contact holes can be controlled, and a failure generated due to the reduction of the interval between the contact holes can be prevented.

Referring to FIGS. 1, 8A, 8B and 8C, the photoresist pattern can be removed. First and second contact patterns 165*a* and 165b, respectively, filling the first and second contact holes 160a and 160b may be formed. For example, the forming of the first and second contact patterns 165a and 165b may include forming a conductive layer on the semiconductor substrate 100 having the first and second contact holes 160a and 160b, and planarizing the conductive layer to remain in the first and second contact holes 160a and 160b. The conductive layer may be planarized using an etch-back technology or a CMP technology. When planarizing the conductive layer using the CMP technology, top surfaces of the capping masks 119 may be lowered. In this case, the capping masks 119 may remain on the gate electrode 113, and the third molding patterns (151 of FIG. 7C) on the capping masks 119 may be removed.

Each of the first and second contact patterns 165a and 165b may be substantially formed in the shape of a rectangle. This is because the first and second contact patterns 165a and 165b are positioned between the gate patterns 123 formed into a line shape, and positioned between the first molding patterns 150a formed in the first openings (145a of FIG. 5A) by the mask patterns (140 of FIGS. 5A, 5B and 5C) having a line shape. Accordingly, the size of each of the first and second contact patterns 165a and 165b can be sufficiently ensured. As a result, a contact area between the active regions 150a at both sides of the gate patterns 123 and the first and second contact patterns 165a and 165b can be sufficiently ensured. That is, a contact area between the first impurity regions 126a and the first contact patterns 165a, and a contact area between the second impurity regions 126b and the second contact patterns 165b can be sufficiently ensured. Thus, a contact resistance characteristic between the first and second impurity regions 126a and 126b, and the first and second contact patterns 165a and 165b can be improved. In addition, a short failure between contact patterns formed between different active regions is prevented so that the yield rate of semiconductor devices can be enhanced.

Referring to FIGS. 1, 9A, 9B and 9C, a lower interlayer dielectric layer 170 may be formed on the semiconductor substrate 100 having the first and second contact patterns 165a and 165b. The lower interlayer dielectric layer 170 may include silicon oxide or the like. Direct contact plugs 175 passing through the lower interlayer dielectric layer 170 and contacting the second contact patterns 165b may be formed. Conductive lines 180 covering the direct contact plugs 175 may be formed on the lower interlayer dielectric layer 170. The conductive lines 180 may be formed to have a direction crossing the gate patterns 123. Insulative spacers (not shown) may be formed on sidewalls of the conductive lines 180. Each of the insulative spacers may be formed of a material having an etching selection ratio with respect to the lower interlayer dielectric layer 170.

An upper interlayer dielectric layer 185 may be formed on the semiconductor substrate 100 having the conductive lines 180. The upper interlayer dielectric layer 185 may include silicon oxide or the like. Buried contact plugs 190 passing through the upper and lower interlayer dielectric layers 185 and 170 and contacting the first contact patterns 165a may be formed.

Data storage elements 195 covering the buried contact plugs 190 may be formed on the upper interlayer dielectric layer 185. The data storage elements 195 may, for example, include capacitor dielectric layers. Thus, the data storage element 195 may be a capacitor in a memory device such as DRAM. In one embodiment, the data storage element 195 may include a non-volatile data storage medium. For example, the data storage element 195 may include a resistive material layer such as a phase-change material layer.

As described above, according to the embodiments of the present invention, line patterns substantially parallel with one another are formed on a semiconductor substrate, molding patterns positioned between line patterns and spaced apart from one another are formed, and a contact structure positioned between the line patterns and positioned between the molding patterns is formed. Such a contact structure is formed on an active region of the semiconductor substrate. Because a process of forming a photoresist pattern having a hole-type opening can be omitted, the limitation of a photolithography process can be overcome. Further, a sufficient process margin for forming the contact structure can be ensured. Accordingly, a highly integrated semiconductor device can be fabricated using a method of forming the aforementioned contact structure. Furthermore, a contact area between the contact structure and the active region can be sufficiently ensured. Accordingly, a contact resistance characteristic between the contact structure and the active region can be improved.

The following paragraphs provide exemplary, non-limiting embodiments of the present invention.

In accordance with an exemplary embodiment, the present invention provides a method of forming a contact structure. The method of forming a contact structure includes forming line patterns parallel with one another on a substrate. Molding patterns spaced apart from one another between the line patterns are formed. A contact pattern positioned between the molding patterns and positioned between the line patterns is formed.

Preferably, each of the line patterns may include a conductive pattern and a capping mask, which are sequentially stacked, and a spacer formed on sidewalls of the conductive pattern and the capping mask.

Preferably, the operation of forming the molding patterns may include forming a sacrificial layer on the substrate having the line patterns; forming mask patterns on the sacrificial layer, each of the mask patterns being formed in a line shape extending along a direction crossing the line patterns; forming openings by etching the sacrificial layer using the mask patterns as an etching mask, the sacrificial layer remaining beneath the mask patterns; removing the mask patterns; forming a molding material layer on the substrate having the openings; forming the molding patterns by planarizing the molding material layer until a top surface of the remaining sacrificial layer is exposed; and etching the remaining sacrificial layer using the molding patterns and the line patterns as an etching mask.

Preferably, before forming the sacrificial layer, the operation of forming the molding patterns may further include forming a conformal etch stop layer on the substrate having the line patterns.

Preferably, each of the molding patterns may be formed as an insulating material layer.

In accordance with another exemplary embodiment, the present invention provides a method of forming a contact structure in a semiconductor device. The method of forming a contact structure includes forming an isolation region defining active regions in a semiconductor substrate. Gate patterns extending to the isolation region while crossing the active regions are formed. A sacrificial layer is formed on the semiconductor substrate having the gate patterns. Sacrificial patterns remaining on the active regions by patterning the sacrificial layer are formed. Molding patterns are formed on the isolation region. Contact holes exposing the active regions at both sides of the gate patterns are formed by etching the sacrificial patterns using the molding pattern and the gate pattern as an etching mask. Contact patterns respectively filling the contact holes are formed.

Preferably, each of the gate patterns may include a gate dielectric layer, a gate electrode and a capping mask, which are sequentially stacked on the active regions. Preferably, each of the gate patterns may further include a gate spacer covering sidewalls of the gate electrode and the capping mask.

Preferably, after forming the gate patterns, the method of forming a contact structure may further include forming a conformal etch stop layer on the semiconductor substrate having the gate patterns.

Preferably, the operation of forming the sacrificial patterns may include forming mask patterns overlapping with the active regions on the semiconductor substrate having the sacrificial layer; forming openings by etching the sacrificial layer using the mask patterns as an etching mask, the sacrificial patterns remaining beneath the mask patterns; and removing the mask patterns.

Preferably, each of the molding patterns may be formed as an insulating material layer.

In another aspect of the present invention, the present invention provides a method of fabricating a semiconductor device using a method of forming a contact structure. The method of fabricating a semiconductor device includes preparing a semiconductor substrate and forming an isolation region defining active regions in a semiconductor substrate. Gate patterns spaced apart from one another on the active regions and the isolation region are formed. In this case, each of the gate patterns has a line shape and is formed to cross the active regions. First molding patterns spaced apart from one another between the gate patterns are formed. Contact patterns positioned between the first molding patterns and positioned between the gate patterns are formed.

Preferably, the semiconductor substrate may have a cell array region and a core region, and the active regions may be positioned in the cell array region.

Preferably, the active regions may be two-dimensionally arrayed in the cell array region, and each of the active regions may have major and minor axes. Preferably, one or two or more of the gate patterns may be positioned in each of the active regions, and the gate patterns may be arranged to be positioned between the active regions arranged along a direction of the major axis.

Preferably, the gate patterns may be formed to cross the cell array region.

Preferably, the operation of forming the first molding patterns may include forming a sacrificial layer on the semiconductor substrate having the gate patterns; forming first openings positioned between the active regions in the cell array region by patterning the sacrificial layer, the sacrificial layer remaining on the active regions; forming the first molding patterns filling the first openings; and removing the sacrificial layer remaining on the active regions in the cell array region using the first molding patterns and the gate patterns as an etching mask.

Preferably, the patterning the sacrificial layer may include forming mask patterns on the sacrificial layer, each of the mask patterns being formed in a line shape extending along a direction crossing the gate patterns and formed to overlap with the active regions in the cell array region; etching the sacrificial layer using the mask patterns as an etching mask; and removing the mask patterns.

Preferably, the patterning the sacrificial layer may further include forming a second opening surrounding the cell array region by patterning the sacrificial layer in the core region while forming the first openings; and forming a second molding pattern filling the second opening while forming the first molding patterns.

Preferably, the operation of forming the first molding patterns may include forming a sacrificial layer on the semiconductor substrate having the gate patterns; forming first openings positioned between the active regions by patterning the sacrificial layer, the sacrificial layer remaining on the active regions; forming first molding patterns filling the first openings; and removing the sacrificial layer remaining on the active regions using the first molding patterns and the gate patterns as an etching mask.

Preferably, each of the first molding patterns may be formed as an insulating material layer.

Preferably, each of the gate patterns may include a gate dielectric layer, a gate electrode and a capping mask, which are sequentially stacked on the active regions. More preferably, each of the gate patterns may further include a gate spacer formed on sidewalls of the gate electrode and the capping mask.

Preferably, after forming the gate patterns, the method of fabricating a semiconductor device may further include forming a conformal etch stop layer on the semiconductor substrate having the gate patterns.

Preferably, the method of fabricating a semiconductor device may further include forming an interlayer dielectric layer on the semiconductor substrate having the contact patterns; forming a contact plug passing through the interlayer dielectric layer and electrically connected to one of the contact patterns positioned at both sides of each of the gate patterns; and forming a data storage element overlapping with the contact plug on the interlayer dielectric layer.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a contact structure, comprising:
   forming line patterns on a substrate, wherein the line patterns are substantially parallel with one another;
   forming molding patterns between the line patterns, wherein the molding patterns are spaced apart from one another; and
   forming a contact pattern between the molding patterns and between the line patterns.

2. The method according to claim 1, wherein each of the line patterns includes a conductive pattern and a capping mask, which are sequentially stacked, and a spacer formed on sidewalls of the conductive pattern and the capping mask.

3. The method according to claim 1, wherein the forming of the molding patterns comprises:
   forming a sacrificial layer on the substrate having the line patterns;
   forming mask patterns on the sacrificial layer, each of the mask patterns being formed in a line shape extending along a direction crossing the line patterns;
   forming openings by etching the sacrificial layer using the mask patterns as an etching mask, the sacrificial layer remaining beneath the mask patterns;
   removing the mask patterns;
   forming a molding material layer on the substrate having the openings;

planarizing the molding material layer until a top surface of the remaining sacrificial layer is exposed; and etching the remaining sacrificial layer using the molding patterns and the line patterns as an etching mask.

4. The method according to claim 3, before forming the sacrificial layer, further comprising forming a conformal etch stop layer on the substrate having the line patterns.

5. The method according to claim 1, wherein each of the molding patterns comprises an insulating material.

6. A method of forming a contact structure, comprising:
forming an isolation region defining active regions in a semiconductor substrate;
forming gate patterns extending to the isolation region while crossing the active regions;
forming a sacrificial layer on the semiconductor substrate having the gate patterns;
patterning the sacrificial layer, thereby forming sacrificial patterns remaining on the active regions;
forming molding patterns on the isolation region;
etching the sacrificial patterns using the molding pattern and the gate pattern as an etching mask, thereby forming contact holes exposing the active regions at both sides of the gate patterns; and
forming contact patterns respectively filling the contact holes.

7. The method according to claim 6, wherein each of the gate patterns includes a gate dielectric layer, a gate electrode and a capping mask, which are sequentially stacked on the active regions.

8. The method according to claim 7, wherein each of the gate patterns further includes a gate spacer covering sidewalls of the gate electrode and the capping mask.

9. The method according to claim 6, after forming the gate patterns, further comprising forming a conformal etch stop layer on the semiconductor substrate having the gate patterns.

10. The method according to claim 6, wherein the forming of the sacrificial patterns comprises:
forming mask patterns overlapping with the active regions on the semiconductor substrate having the sacrificial layer;
etching the sacrificial layer using the mask patterns as an etching mask to form openings in the sacrificial layer, the sacrificial patterns remaining beneath the mask patterns; and
removing the mask patterns.

11. The method according to claim 6, wherein each of the molding patterns includes an insulating material.

12. A method of fabricating a semiconductor device, comprising:
preparing a semiconductor substrate;
forming an isolation region defining active regions in the semiconductor substrate;
forming gate patterns on the active regions and the isolation region, each of the gate patterns having a line shape crossing the active regions, wherein the gate patterns are spaced apart from one another;
forming first molding patterns between the gate patterns, wherein the first molding patterns are spaced apart from one another; and
forming contact patterns between the first molding patterns and between the gate patterns.

13. The method according to claim 12, wherein the semiconductor substrate has a cell array region and a core region, and wherein the active regions are positioned in the cell array region.

14. The method according to claim 13, wherein the active regions are two-dimensionally arrayed in the cell array region, and wherein each of the active regions has a major axis and a minor axis.

15. The method according to claim 14, wherein one or two or more of the gate patterns are positioned in each of the active regions, and wherein the gate patterns are positioned between the active regions along a direction of the major axis.

16. The method according to claim 13, wherein the gate patterns cross the cell array region.

17. The method according to claim 13, wherein the forming of the first molding patterns comprises:
forming a sacrificial layer on the semiconductor substrate having the gate patterns;
patterning the sacrificial layer to form first openings positioned between the active regions in the cell array region, wherein the sacrificial layer remains on the active regions;
forming the first molding patterns filling the first openings; and
removing the sacrificial layer remaining on the active regions in the cell array region using the first molding patterns and the gate patterns as an etching mask.

18. The method according to claim 17, wherein the patterning of the sacrificial layer comprises:
forming mask patterns on the sacrificial layer, each of the mask patterns being formed in a line shape extending along a direction crossing the gate patterns and formed to overlap with the active regions in the cell array region;
etching the sacrificial layer using the mask patterns as an etching mask; and
removing the mask patterns.

19. The method according to claim 17, further comprising:
patterning the sacrificial layer in the core region while forming the first openings to form a second opening surrounding the cell array region; and
filling the second opening while forming the first molding patterns to form a second molding pattern.

20. The method according to claim 12, wherein the forming of the first molding patterns comprises:
forming a sacrificial layer on the semiconductor substrate having the gate patterns;
patterning the sacrificial layer to form first openings positioned between the active regions, wherein the sacrificial layer remains on the active regions;
forming first molding patterns filling the first openings; and
removing the sacrificial layer remaining on the active regions using the first molding patterns and the gate patterns as an etching mask.

21. The method according to claim 12, wherein each of the first molding patterns includes an insulating material.

22. The method according to claim 12, wherein each of the gate patterns includes a gate dielectric layer, a gate electrode and a capping mask, which are sequentially stacked on the active regions.

23. The method according to claim 22, wherein each of the gate patterns further includes a gate spacer formed on sidewalls of the gate electrode and the capping mask.

24. The method according to claim 12, after forming the gate patterns, further comprising forming a conformal etch stop layer on the semiconductor substrate having the gate patterns.

25. The method according to claim 12, further comprising:
forming an interlayer dielectric layer on the semiconductor substrate having the contact patterns;

forming a contact plug passing through the interlayer dielectric layer and electrically connected to one of the contact patterns positioned at both sides of each of the gate patterns; and forming a data storage element overlapping with the contact plug on the interlayer dielectric layer.

* * * * *